(12) United States Patent
    Maeda

(10) Patent No.: US 9,047,671 B2
(45) Date of Patent: Jun. 2, 2015

(54) PLATELIKE WORKPIECE WITH ALIGNMENT MARK

(71) Applicant: DISCO CORPORATION, Tokyo (JP)

(72) Inventor: Nobuhide Maeda, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/244,086

(22) Filed: Apr. 3, 2014

(65) Prior Publication Data

US 2014/0301631 A1    Oct. 9, 2014

(30) Foreign Application Priority Data

Apr. 3, 2013    (JP) ................................. 2013-077638

(51) Int. Cl.
    *G06T 3/00*    (2006.01)
(52) U.S. Cl.
    CPC ..... *G06T 3/0068* (2013.01); *G06T 2207/30148* (2013.01)
(58) Field of Classification Search
    CPC ................................................... G06T 3/0068
    USPC ........................................................ 382/151
    See application file for complete search history.

(56) References Cited

U.S. PATENT DOCUMENTS

| | | | | |
|---|---|---|---|---|
| 6,970,588 | B1* | 11/2005 | Komatsu | 382/141 |
| 2002/0009219 | A1* | 1/2002 | Matsuoka | 382/141 |
| 2003/0235330 | A1* | 12/2003 | Tanaka | 382/151 |
| 2009/0108483 | A1* | 4/2009 | Suehira et al. | 264/40.5 |

FOREIGN PATENT DOCUMENTS

| | | |
|---|---|---|
| JP | 60-244803 | 12/1985 |
| JP | 2002-261232 | 9/2002 |

* cited by examiner

*Primary Examiner* — Stephen R Koziol
*Assistant Examiner* — Delomia Gilliard
(74) *Attorney, Agent, or Firm* — Greer Burns & Crain, Ltd.

(57) ABSTRACT

A platelike workpiece having an alignment mark formed on the front side thereof and adapted to be recognized by an imaging unit included in an alignment apparatus for performing alignment. The platelike workpiece includes a plurality of direction indicating marks formed at given intervals so as to surround the alignment mark. Each of the direction indicating marks is pointed toward the alignment mark. The space of the direction indicating marks is set so that at least two of the plural direction indicating marks fall in the visual field of the imaging unit in viewing the platelike workpiece from the imaging unit.

5 Claims, 5 Drawing Sheets

PLATELIKE WORKPIECE WITH ALIGNMENT MARK

BACKGROUND OF THE INVENTION

1. Field of the Invention

The present invention relates to a platelike workpiece with an alignment mark to be used in an alignment apparatus for detecting an area to be processed or aligning attachment positions.

2. Description of the Related Art

In recent years, a mounting technique using Si through electrodes (Through-Silicon Via: TSV) instead of wires has received attention as a new three-dimensional mounting technique. For example, as a stacking method for semiconductor device chips, there has been developed a stacking method including the steps of stacking a plurality of semiconductor wafers and forming through electrodes extending through these stacked semiconductor wafers to thereby connect these stacked semiconductor wafers (Wafer On Wafer: WOW, see Japanese Patent Laid-open No. 2002-261232). In this stacking method, the upper and lower semiconductor wafers to be stacked are aligned in the following manner. Imaging means such as an infrared camera is used to image an alignment mark formed on the front side of the upper semiconductor wafer facing the imaging means and further image an alignment mark formed on the front side of the lower semiconductor wafer opposite to the imaging means as viewing through the upper semiconductor wafer. Thereafter, the alignment marks of the upper and lower semiconductor wafers are registered to thus perform an alignment operation.

Further, in the case of a semiconductor wafer having a plurality of circuits such as ICs and LSIs separated by a plurality of crossing streets, this semiconductor wafer is cut along the streets by using a cutting blade or a laser beam (dicing) to thereby obtain a plurality of individual semiconductor chips respectively including the circuits. In this manner, the dicing is performed along the streets. Accordingly, prior to performing the dicing, alignment is performed to detect the streets and align the cutting blade, for example, with each street at a cutting start position. This alignment is performed in the following manner. Imaging means in an alignment apparatus is used to image the front side of the semiconductor wafer. Thereafter, pattern matching is performed between an alignment mark formed on the front side of the semiconductor wafer and an alignment mark preliminarily stored in the alignment apparatus, thereby detecting the alignment mark on the front side of the semiconductor wafer. The detection of the alignment mark must be quickly performed in order to improve the productivity.

SUMMARY OF THE INVENTION

However, the detection of the alignment mark by the imaging means in the various cases mentioned above has similar problems. That is, a considerable amount of transfer error is generated in placing a semiconductor wafer on a stage of the alignment apparatus and there is a case that the transfer error becomes larger in range than the visual field of the imaging means in the alignment apparatus. When the alignment mark comes out of the visual field of the imaging means due to the transfer error, the alignment mark cannot be detected by the imaging means. Accordingly, when the alignment mark comes out of the visual field of the imaging means, it is necessary to perform an operation of locating the alignment mark in the visual field of the imaging means prior to detecting the alignment mark. In this operation, an operator moves the stage bit by bit in various directions to locate the alignment mark in the visual field of the imaging means. However, much time is required to perform this operation.

Further, alignment using two infrared cameras having different magnifications has been proposed (see Japanese Patent Publication No. Hei 3-27043). In the alignment described in Japanese Patent Publication No. Hei 3-27043, an alignment mark is first detected in a wide visual field by using an infrared camera having a low magnification, wherein a semiconductor wafer is roughly aligned so as to locate the alignment mark in the visual field of the infrared camera having the low magnification. Thereafter, the infrared camera having the low magnification is replaced by an infrared camera having a high magnification, and the alignment mark is detected by using the infrared camera having the high magnification to accurately align the semiconductor wafer. Thusly, this alignment requires the two infrared cameras, causing an increase in cost.

It is therefore an object of the present invention to provide a platelike workpiece with an alignment mark which can shorten the time required to perform the alignment in various kinds of processing.

In accordance with an aspect of the present invention, there is provided a platelike workpiece having an alignment mark formed on the front side thereof and adapted to be recognized by imaging means included in an alignment apparatus for performing alignment, the platelike workpiece including a plurality of direction indicating marks formed at given intervals so as to surround the alignment mark, each of the direction indicating marks being pointed toward the alignment mark, the space of the direction indicating marks being set so that at least two of the plural direction indicating marks fall in the visual field of the imaging means in viewing the platelike workpiece from the imaging means.

Preferably, the forming area of the plural direction indicating marks is set larger than the maximum range of transfer error assumed in placing the platelike workpiece in the alignment apparatus, about at least the alignment mark.

In the platelike workpiece of the present invention, the plural direction indicating marks for indicating the direction toward the alignment mark are formed about the alignment mark within at least the maximum range of transfer error. Accordingly, even when the alignment mark is not seen in the visual field of the imaging means such as a camera, the alignment mark can be detected easily and quickly by following the direction indicating marks. That is, wandering of a detection route in relatively moving the imaging means and the platelike workpiece can be avoided and the detection route can be shortened in locating the alignment mark in the visual field of the imaging means. Further, even when single imaging means having a high magnification and a narrow visual field is used, the alignment mark can be located in the visual field easily and quickly by following the direction indicating marks. The operation of exchanging two imaging means having different magnifications as in the prior art can be eliminated and the operation time can be greatly reduced to thereby improve the productivity and operability.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS (First Preferred Embodiment)

Figure 1:
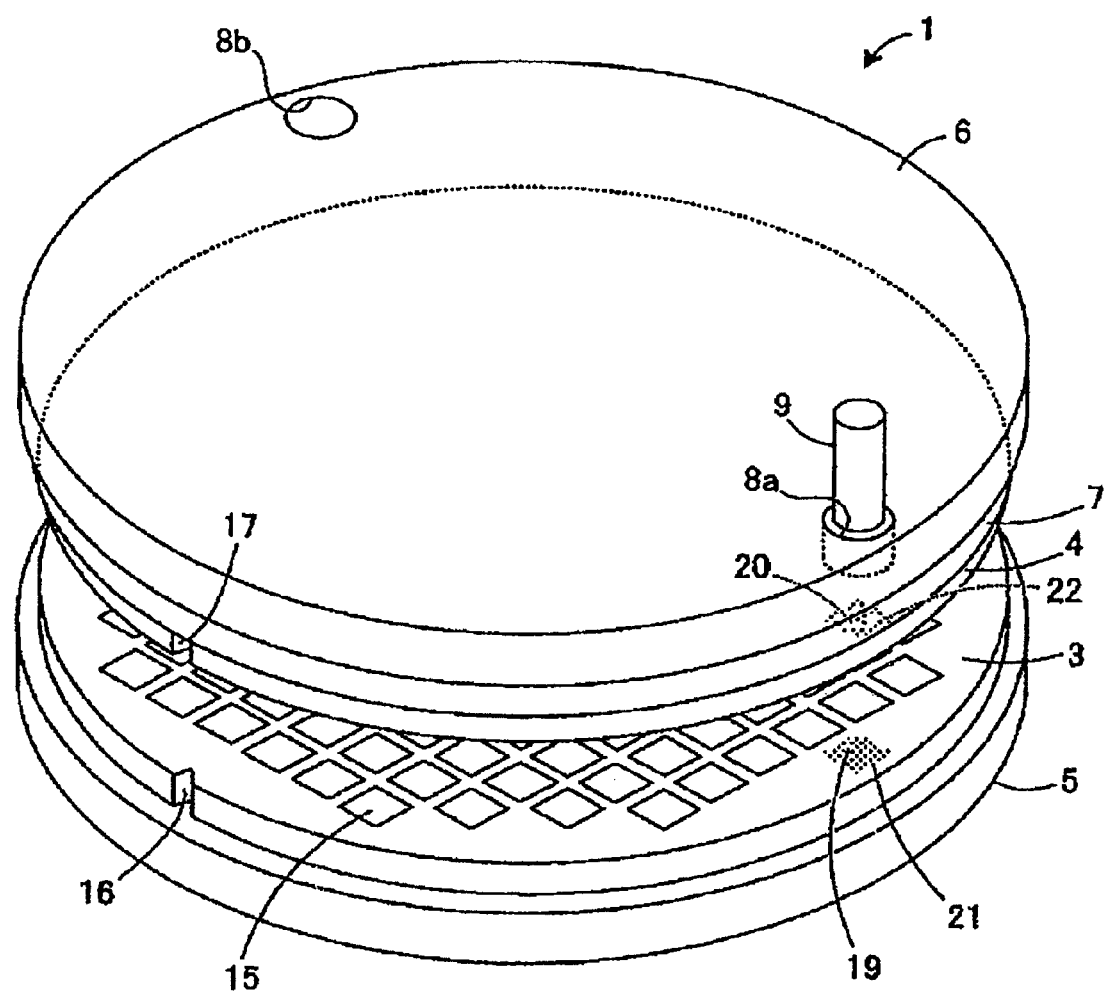
FIG. 1 is a perspective view of an alignment apparatus according to a first preferred embodiment of the present invention.
Figure 2:
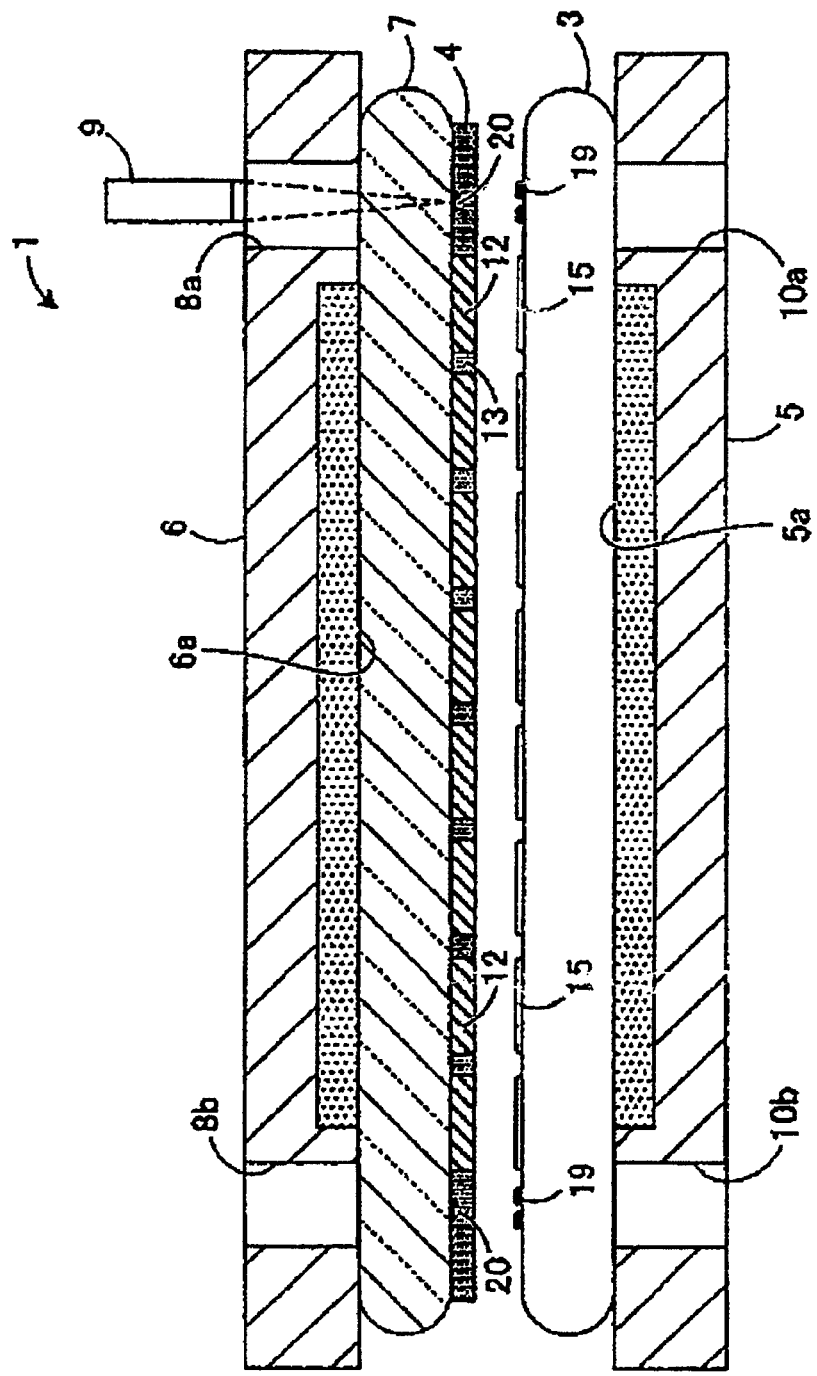
FIG. 2 is a partially sectional elevational view of the alignment apparatus shown in FIG. 1.

A first preferred embodiment of the present invention will now be described with reference to the drawings. FIG. 1 is a perspective view of an alignment apparatus 1 for performing the alignment of a platelike workpiece according to this preferred embodiment. FIG. 2 is a partially sectional elevational view of the alignment apparatus 1 shown in FIG. 1. The alignment apparatus 1 will first be described and the platelike workpiece according to this preferred embodiment will next be described. The configuration of the alignment apparatus 1 shown in FIGS. 1 and 2 is merely illustrative and may be suitably modified. The configuration shown in FIGS. 1 and 2 may be applied to any other apparatuses having an alignment function. Further, while a semiconductor wafer is used as the platelike workpiece in this preferred embodiment, the platelike workpiece according to the present invention is not limited to this preferred embodiment.

As shown in FIGS. 1 and 2, the alignment apparatus 1 is so configured as to support a first platelike or plate-shaped workpiece 3 and a second platelike or plate-shaped workpiece 4 to be attached to the first platelike workpiece 3 and align them with each other. The alignment apparatus 1 has a lower attachment stage 5 (lower support) and an upper attachment stage 6 (upper support). The lower attachment stage 5 and the upper attachment stage 6 are relatively movable in a horizontal direction through a drive mechanism (not shown). As shown in FIG. 2, the upper surface of the lower attachment stage 5 is opposed to the lower surface of the upper attachment stage 6, wherein the upper surface of the lower attachment stage 5 includes a holding surface 5a and the lower surface of the upper attachment stage 6 includes a holding surface 6a. These holding surfaces 5a and 6a are formed of a porous ceramic material and connected through suction lines to a vacuum source (not shown) to thereby hold the first and second platelike workpieces 3 and 4 under suction. More specifically, the first platelike workpiece 3 is held under suction to the holding surface 5a of the lower attachment stage 5, and a transparent glass support substrate 7 to which the second platelike workpiece 4 is bonded is held under suction to the holding surface 6a of the upper attachment stage 6.

Two holes 10a and 10b are formed through the thickness of the lower attachment stage 5 in a peripheral portion thereof. Similarly, two sight holes 8a and 8b are formed through the thickness of the upper attachment stage 6 in a peripheral portion thereof so as to respectively correspond to the holes 10a and 10b of the lower attachment stage 5. Imaging means 9 is provided above the sight hole 8a. The imaging means 9 is configured by an infrared camera, for example. The imaging means 9 can recognize as an image the front side of the second platelike workpiece 4 through the sight hole 8a and can also recognize as an image the front side of the first platelike workpiece 3 through the second platelike workpiece 4.

Figure 3A:
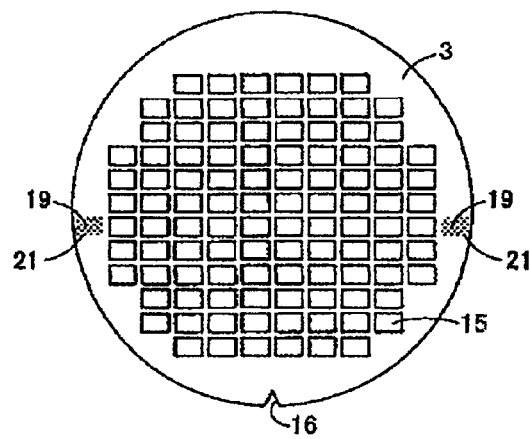
FIGS. 3A to 3C are plan views for illustrating a platelike workpiece according to the first preferred embodiment.

The first platelike workpiece 3 and the second platelike workpiece 4 will now be described with reference to FIGS. 1, 2, and 3A to 3C. FIG. 3A is a plan view of the first platelike workpiece 3, showing its front side where devices are formed. In this preferred embodiment, the first platelike workpiece 3 is a semiconductor wafer having a plurality of crossing division lines on the front side, wherein a plurality of separate regions are defined by these division lines and a plurality of semiconductor devices 15 such as ICs and LSIs are respectively formed in these separate regions. A notch 16 as a mark for indicating a crystal orientation is formed on the outer circumference of the first platelike workpiece 3.

Figure 3B:
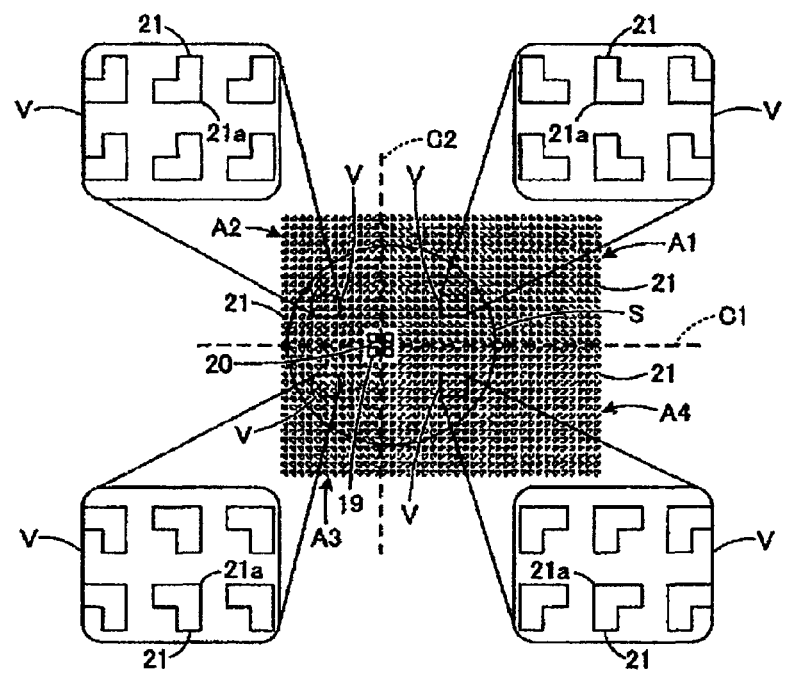
Figure 3C:
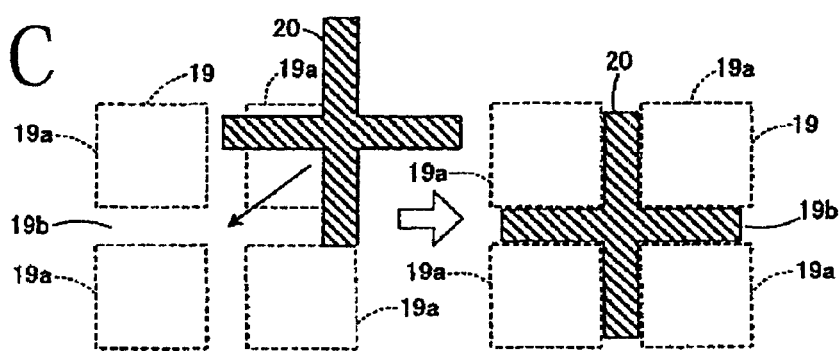

Two first alignment marks 19 are provided on the front side (device forming side) of the first platelike workpiece 3 in a peripheral area formed outside a device area where the semiconductor devices 15 are formed. Further, as shown in FIG. 3B, a plurality of direction indicating marks 21 are provided so as to surround each first alignment mark 19. As shown in FIG. 3C, each first alignment mark 19 is configured by a collection of four rectangular mark segments 19a. These four rectangular mark segments 19a are arranged in two rows and two columns so as to form a central cross space 19b.

As shown in FIG. 3B, each of the plural direction indicating marks 21 surrounding the corresponding first alignment mark 19 has an L-shaped configuration as viewed in plan. As described later, each direction indicating mark 21 indicates a direction toward the corresponding first alignment mark 19 as viewed from the position of the direction indicating mark 21 in accordance with the orientation of the L-shape. In FIG. 3B, reference symbol V denotes a visual field of the imaging means 9. The direction indicating marks 21 are arranged at given intervals in plural rows and columns about each first alignment mark 19. The size and space of the direction indicating marks 21 are set so that at least two of the plural direction indicating marks 21 fall in the visual field V of the imaging means 9. Furthermore, the forming area of the plural direction indicating marks 21 is set larger than the maximum range of transfer error assumed in placing the first platelike workpiece 3 in the alignment apparatus 1, about at least each first alignment mark 19. For example, in the case that the maximum range of transfer error is shown by a circular area S in FIG. 3B, the forming area of the plural direction indicating marks 21 is larger than the circular area S and fully includes this area S. Accordingly, even when each first alignment mark 19 completely comes out of the visual field V of the imaging means 9, at least two of the plural direction indicating marks 21 fall into the visual field V.

Each direction indicating mark 21 has an L-shape oriented toward the corresponding first alignment mark 19 as viewed from the position of the direction indicating mark 21. The orientation of each direction indicating mark 21 will now be described in detail with reference to FIG. 3B. For convenience of illustration, the straight lines extending through the cross space 19b formed by the four rectangular mark segments 19a constituting each first alignment mark 19 will be hereinafter referred to as a horizontal axis C1 and a vertical axis C2. The forming area of the plural direction indicating marks 21 is divided into four areas by the horizontal axis C1 and the vertical axis C2. These four areas will be hereinafter referred to as a right upper area A1 formed on the right upper side of the first alignment mark 19, a left upper area A2 formed on the left upper side of the first alignment mark 19, a left lower area A3 formed on the left lower side of the first alignment mark 19, and a right lower area A4 formed on the right lower side of the first alignment mark 19. In all of these four areas A1 to A4, the direction indicating marks 21 have the same L-shape. However, the L-shape of the direction indicating marks 21 is different in orientation according to the four areas A1 to A4. In the case of the direction indicating marks 21 in the right upper area A1, for example, each L-shaped direction indicating mark 21 has a left lower corner 21a pointed in the left lower direction, or the obliquely downward direction to the left. Accordingly, all of the direction indicating marks 21 in the right upper area A1 are so formed as to be pointed in the left lower direction, i.e., in the direction toward the first alignment mark 19 or the position therenear. As similar to the direction indicating marks 21 in the right upper area A1, the orientations of the other direction indicating marks 21 in the left upper area A2, the left lower area A3, and the right lower area A4 are set so as to be pointed toward the first alignment mark 19 or the position therenear.

As shown in FIG. 2, the second platelike workpiece 4 is a semiconductor wafer having a plurality of semiconductor device chips 12 in which semiconductor devices such as ICs and LSIs are formed. As shown in FIG. 1, a notch 17 corresponding to the notch 16 of the first platelike workpiece 3 is formed on the outer circumference of the second platelike workpiece 4. The second platelike workpiece 4 is formed in the following manner before it is loaded to the alignment apparatus 1. First, the semiconductor device chips 12 are separately provided on the glass support substrate 7 and bonded to the substrate 7 through a releasable adhesive. Thereafter, a resin 13 such as epoxy resin is applied so as to cover the semiconductor device chips 12, thereby sealing the semiconductor device chips 12. Thereafter, the resin 13 and the semiconductor device chips 12 are ground by using a grinding apparatus to thereby reduce the thickness of the second platelike workpiece 4 as a whole. Thus, the second platelike workpiece 4 bonded to the glass support substrate 7 as shown in FIG. 2 is formed.

Two second alignment marks 20 are formed on the front side (upper surface as viewed in FIG. 2) of the second platelike workpiece 4 in a peripheral area thereof by any suitable processing such as printing and cutting. Each second alignment mark 20 has substantially the same cross shape as that of the cross space 19b of each first alignment mark 19 as viewed in plan (see FIG. 3C). When each second alignment mark 20 comes into coincidence with the cross space 19b of the corresponding first alignment mark 19, the second platelike workpiece 4 is aligned with the first platelike workpiece 3. As shown in FIG. 1, a plurality of direction indicating marks 22 are provided on the second platelike workpiece 4 so as to surround each second alignment mark 20. As similar to the direction indicating marks 21 surrounding each first alignment mark 19, the direction indicating marks 22 are formed to surround each second alignment mark 22. Further, the shape, size, and position of the direction indicating marks 22 are similar to those of the direction indicating marks 21.

There will now be described a method of aligning the first platelike workpiece 3 and the second platelike workpiece 4 by using the alignment apparatus 1. As shown in FIG. 2, the second platelike workpiece 4 bonded to the glass support substrate 7 is loaded to the alignment apparatus 1, and the glass support substrate 7 is held to the upper attachment stage 6 under suction. Just thereafter, the first platelike workpiece 3 is loaded to the alignment apparatus 1 and held on the lower attachment stage 5 under suction. In this condition, the notch 16 of the first platelike workpiece 3 and the notch 17 of the second platelike workpiece 4 are detected through detecting means (not shown). Thereafter, at least one of the stages 5 and 6 is rotated according to detection data on the notches 16 and 17, thereby aligning the first and second platelike workpieces 3 and 4 in their circumferential direction. Thereafter, the focus adjustment for the imaging means 9 is performed so that the plural direction indicating marks 22 surrounding the second alignment mark 20 corresponding to the sight hole 8a are clearly viewed through the glass support substrate 7 within the visual field V of the imaging means 9. In this focus adjustment, the effort required to adjust the focus of the imaging means 9 can be reduced as compared with the case that the direction indicating marks 22 are absent. Thereafter, the visual field V of the imaging means 9 is moved to follow the direction indicating marks 22 and approach the second alignment mark 20 until the second alignment mark 20 falls into the visual field V. Thereafter, the focus adjustment for the imaging means 9 is performed to detect the first alignment mark 19 corresponding to the sight hole 8a so that the plural direction indicating marks 21 surrounding the first alignment mark 19 are clearly viewed through the second platelike workpiece 4 within the visual field V of the imaging means 9. In this focus adjustment, the effort required to adjust the focus of the imaging means 9 can be reduced as compared with the case that the direction indicating marks 21 are absent.

For example, in the case that the visual field V is present in the right upper area A1 shown in FIG. 3B in detecting the front side of the first platelike workpiece 3, at least two of the plural direction indicating marks 21 are detected in the visual field V and the direction indicating marks 21 are pointed in the left lower direction toward the first alignment mark 19. According to the result of this detection, the imaging means 9 and the upper attachment stage 6 are moved in the left lower direction by an operator. During this movement, the visual field V of the imaging means 9 is moved to follow the direction indicating marks 21 in the right upper area A1 and approach the first alignment mark 19 until the first alignment mark 19 falls into the visual field V. When the first alignment mark 19 falls into the visual field V, the imaging means 9 and the upper attachment stage 6 are slightly moved so that the second alignment mark 20 comes into coincidence with the cross space 19b formed by the rectangular mark segments 19a of the first alignment mark 19 (see FIG. 3C). In the condition where the second alignment mark 20 coincides with the cross space 19b of the first alignment mark 19, the upper attachment stage 6 is positioned to thereby align the first platelike workpiece 3 and the second platelike workpiece 4 with each other.

Also in the case that the visual field V is present in any one of the areas A2 to A4 different from the right upper area A1, the above-mentioned alignment is similarly performed except that the direction of movement is different. That is, the visual field V is moved to follow the direction indicating marks 21 in any one of the areas A2 to A4 and approach the first alignment mark 19, so that the first alignment mark 19 can be detected in the visual field V.

According to the first platelike workpiece 3 in this preferred embodiment, even when the first alignment mark 19 comes outside the visual field V of the imaging means 9, the first alignment mark 19 can be located inside the visual field V easily and quickly by following the direction indicating marks 21. In addition, the alignment operation can be performed by using the single imaging means 9. Accordingly, it is possible to eliminate the operation of exchanging a plurality of imaging means having different magnifications, thereby improving the productivity and operability.

(Second Preferred Embodiment)

Figure 4:
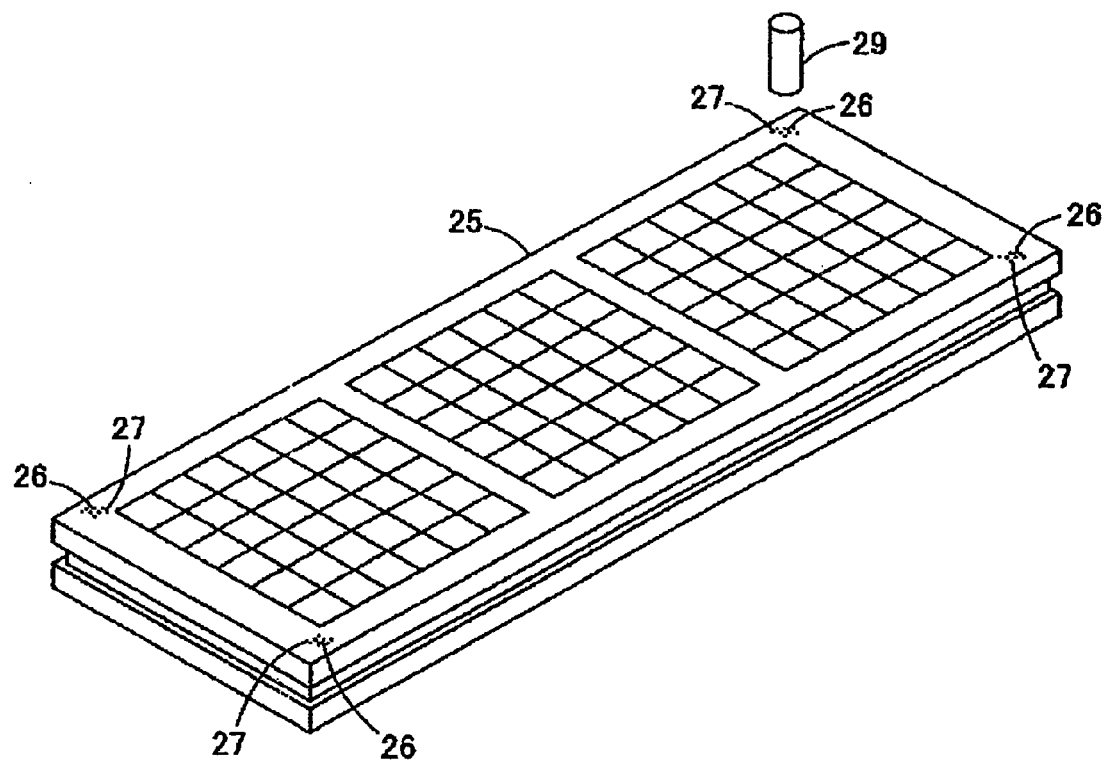
FIG. 4 is a perspective view of a platelike workpiece and imaging means according to a second preferred embodiment of the present invention.
Figure 5:
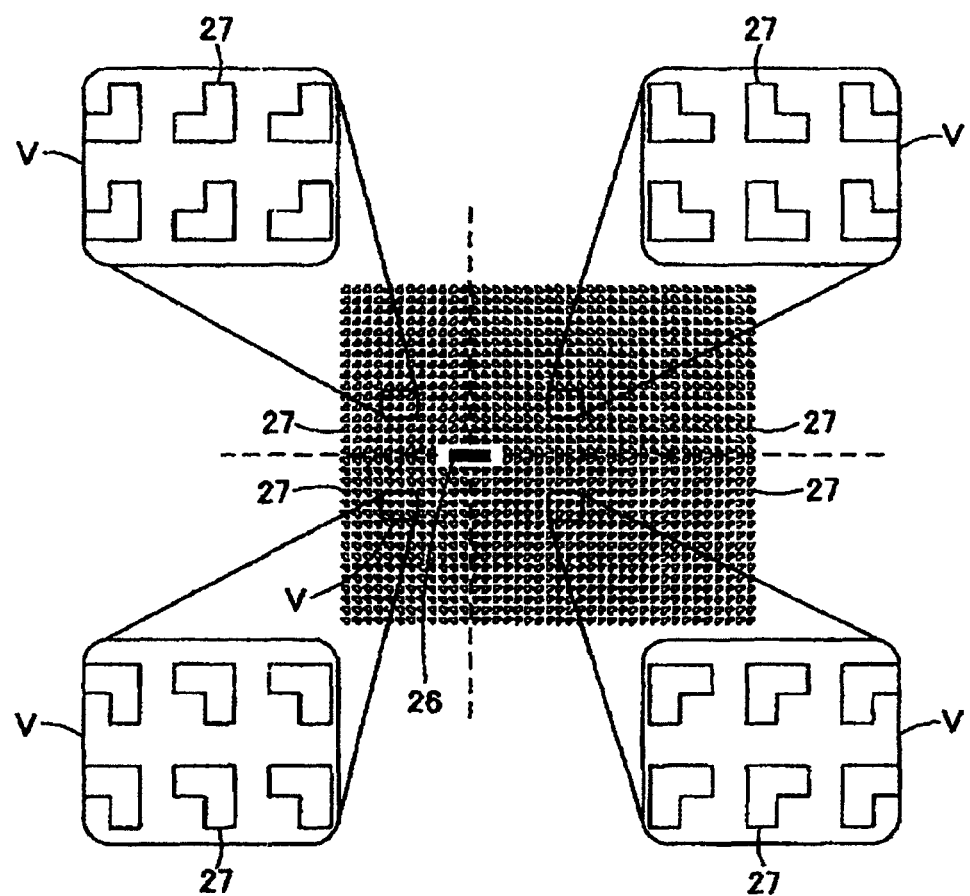
FIG. 5 is an enlarged view of an essential part about an alignment mark provided on the platelike workpiece according to the second preferred embodiment.

A second preferred embodiment of the present invention will now be described with reference to FIGS. 4 and 5. FIG. 4 is a perspective view of a platelike workpiece 25 according to the second preferred embodiment and FIG. 5 is an enlarged view of an essential part about an alignment mark provided on the platelike workpiece 25. As shown in FIG. 4, the platelike workpiece 25 according to this preferred embodiment is a CSP (Chip Size Package) substrate having a substantially rectangular shape as viewed in plan. That is, the platelike workpiece 25 is a CSP substrate on which a plurality of CSPs as semiconductor devices are arranged at equal intervals in rows and columns. The CSPs are spaced from each other by a plurality of crossing division lines (streets). The platelike workpiece 25 is divided by cutting along these division lines to obtain a plurality of CSP chips.

Four alignment marks 26 are formed on the front side of the platelike workpiece 25 at the four corner portions thereof. Further, a plurality of direction indicating marks 27 are formed about each alignment mark 26. As shown in FIG. 5, each alignment mark 26 has a rectangular shape as viewed in plan, and the plural direction indicating marks 27 are so formed as to surround each alignment mark 26. The positional relation between each alignment mark 26 and the corresponding plural direction indicating marks 27 in the second preferred embodiment is similar to that between each first alignment mark 19 and the corresponding plural direction indicating marks 21 in the first preferred embodiment. As shown in FIG. 5, the shape, orientation, and forming area of the direction indicating marks 27 in the second preferred embodiment are the same as those of the direction indicating marks 21 in the first preferred embodiment shown in FIG. 3B, so the description thereof will be omitted herein.

Alignment is performed to the platelike workpiece 25 prior to performing dicing along the streets. Prior to performing this alignment, an alignment mark is preliminarily stored in an alignment apparatus (not shown) including imaging means 29. The platelike workpiece 25 is loaded to the alignment apparatus and held under suction on a chuck table (not shown) included in the alignment apparatus. In this condition, the chuck table is moved to make the visual field V of the imaging means 29 approach any one of the four alignment marks 26 of the platelike workpiece 25. At this time, the direction indicating marks 27 formed near the selected alignment mark 26 are detected in the visual field V of the imaging means 29. Thereafter, as similar to the first preferred embodiment, the visual field V is relatively moved to follow the direction indicating marks 27 until the selected alignment mark 26 falls into the visual field V. Thereafter, the alignment mark 26 thus detected is compared with the alignment mark preliminarily stored in the alignment apparatus to perform pattern matching. In this manner, the alignment of the platelike workpiece 25 is performed.

The present invention is not limited to the above preferred embodiments, but various modifications may be made. The size, shape, etc. of the parts shown in the drawings are merely illustrative and they may be suitably changed within the scope exhibiting the effect of the present invention. Further, the above preferred embodiments may be suitably modified without departing from the scope of the present invention. For example, the shape of the direction indicating marks 21 and 27 may be changed to an arrow-like shape, hand-like shape with a direction indicating finger, etc. Any other shapes indicating the direction toward the alignment marks 19 and 26 may be adopted.

Further, the forming position of the first alignment marks 19 and the direction indicating marks 21 in the first preferred embodiment may be changed as long as these marks 19 and 21 can be recognized by the imaging means 9. Similarly, the forming position of the alignment marks 26 and the direction indicating marks 27 in the second preferred embodiment may be changed as long as these marks 26 and 27 can be recognized by the imaging means 29. For example, the first alignment marks 19 and the direction indicating marks 21 in the first preferred embodiment may be formed in the device area where the semiconductor devices 15 are formed.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A platelike workpiece having an alignment mark formed on the front side thereof and adapted to be recognized by imaging means included in an alignment apparatus for performing alignment, said platelike workpiece comprising:
a plurality of direction indicating marks formed at given intervals so as to surround said alignment mark, each of said direction indicating marks being pointed generally toward said alignment mark such that said direction indicating marks on the opposite sides of said alignment mark are oriented differently, the space of said direction indicating marks being set so that at least two of said plural direction indicating marks fall in the visual field of said imaging means in viewing said platelike workpiece from said imaging means.

2. The platelike workpiece according to claim 1, wherein the forming area of said plural direction indicating marks is set larger than the maximum range of transfer error assumed in placing said platelike workpiece in said alignment apparatus, about at least said alignment mark.

3. The platelike workpiece according to claim 1, wherein each of said direction indicating marks is generally L-shaped.

4. The platelike workpiece according to claim 1, wherein:
each of said direction indicating marks is generally L-shaped and defines two legs with outer edges that intersect at an outer corner; and
all of said outer corners of said direction indicating marks point generally towards said alignment mark.

5. The platelike workpiece according to claim 1, wherein:
a pair of imaginary axes, which are perpendicular to each other, extend through said alignment mark and define four areas that are adjacent said alignment mark,
each of said four areas includes a plurality of said direction indicating marks therein, and
said direction indicating marks within a first of said four areas are pointed generally in a first direction, said direction indicating marks within a second of said four areas are pointed generally in a second direction, said direction indicating marks within a third of said four areas are pointed generally in a third direction, and said direction indicating marks within a fourth of said four areas are pointed generally in a fourth direction, with said first, second, third and fourth directions being different from each other.

* * * * *